(12) United States Patent
Ding et al.

(10) Patent No.: US 10,770,434 B2
(45) Date of Patent: *Sep. 8, 2020

(54) STAIR-STACKED DICE DEVICE IN A SYSTEM IN PACKAGE, AND METHODS OF MAKING SAME

(71) Applicant: Intel Corporation, Santa Clara, CA (US)

(72) Inventors: Zhicheng Ding, Shanghai (CN); Bin Liu, Shanghai (CN); Yong She, Songjiang (CN); Aiping Tan, Shanghai (CN); Li Deng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/326,330

(22) PCT Filed: Sep. 30, 2016

(86) PCT No.: PCT/CN2016/101130
§ 371 (c)(1),
(2) Date: Feb. 18, 2019

(87) PCT Pub. No.: WO2018/058548
PCT Pub. Date: Apr. 5, 2018

(65) Prior Publication Data
US 2019/0214370 A1    Jul. 11, 2019

(51) Int. Cl.
*H01L 23/00*    (2006.01)
*H01L 25/00*    (2006.01)
(Continued)

(52) U.S. Cl.
CPC .......... *H01L 25/0657* (2013.01); *H01L 22/12* (2013.01); *H01L 22/32* (2013.01);
(Continued)

(58) Field of Classification Search
CPC ..... H01L 25/0657; H01L 25/50; H01L 25/18; H01L 22/12; H01L 2225/06506;
(Continued)

(56) References Cited

U.S. PATENT DOCUMENTS

2004/0012079 A1    1/2004 Khiang
2019/0229092 A1*   7/2019 Ding ..................... H01L 24/81

FOREIGN PATENT DOCUMENTS

CN           101950745 A       1/2011
CN            10246828 A       5/2015
WO      WO-2018058548 A1       4/2018

OTHER PUBLICATIONS

"International Application Serial No. PCT/CN2016/101130, International Search Report dated Jul. 6, 2017", 4 pgs.
(Continued)

*Primary Examiner* — Kyoung Lee
(74) *Attorney, Agent, or Firm* — Schwegman Lundberg & Woessner, P.A.

(57) ABSTRACT

A system in package includes a stair-stacked memory module that is stacked vertically with respect to a processor die. A spacer is used adjacent to the processor die to create a bridge for the stair-stacked memory module. Each memory die in the stair-stacked memory module includes a vertical bond wire that emerges from a matrix for connection. The matrix encloses the stair-stacked memory module and at least a portion of the processor die.

21 Claims, 9 Drawing Sheets

(51) Int. Cl.
  *H01L 25/065* (2006.01)
  *H01L 25/18* (2006.01)
  *H01L 21/66* (2006.01)
  *H01L 23/31* (2006.01)

(52) U.S. Cl.
  CPC .............. *H01L 24/49* (2013.01); *H01L 25/18* (2013.01); *H01L 25/50* (2013.01); *H01L 23/3107* (2013.01); *H01L 2224/32145* (2013.01); *H01L 2224/73253* (2013.01); *H01L 2225/0651* (2013.01); *H01L 2225/06517* (2013.01); *H01L 2225/06537* (2013.01); *H01L 2225/06562* (2013.01); *H01L 2225/06575* (2013.01); *H01L 2225/06586* (2013.01); *H01L 2225/06596* (2013.01); *H01L 2924/181* (2013.01)

(58) Field of Classification Search
  CPC . H01L 2225/06596; H01L 2225/06582; H01L 2225/06517; H01L 2225/0651; H01L 2225/06562; H01L 2224/05554; H01L 2224/06135; H01L 2924/1903; H01L 2924/19042; H01L 2924/1434; H01L 2224/1134; H01L 2924/18161; H01L 2924/19105; H01L 2224/73253; H01L 24/16; H01L 24/92; H01L 24/13; H01L 24/85; H01L 24/11; H01L 2224/81801; H01L 2224/13101; H01L 24/45; H01L 2224/13655; H01L 2224/13147; H01L 2224/85947; H01L 2224/85001; G01R 31/2896
  See application file for complete search history.

(56) References Cited

OTHER PUBLICATIONS

"International Application Serial No. PCT/CN2016/101130, Written Opinion dated Jul. 6, 2017", 5 pgs.

* cited by examiner

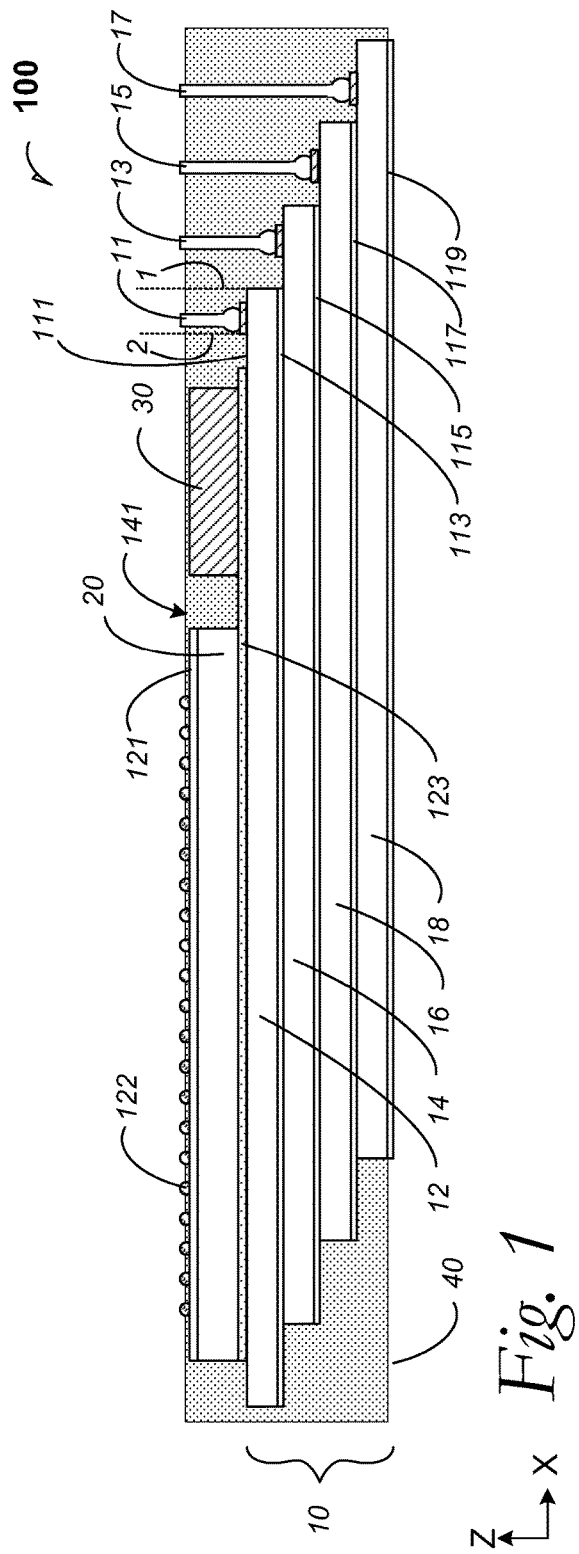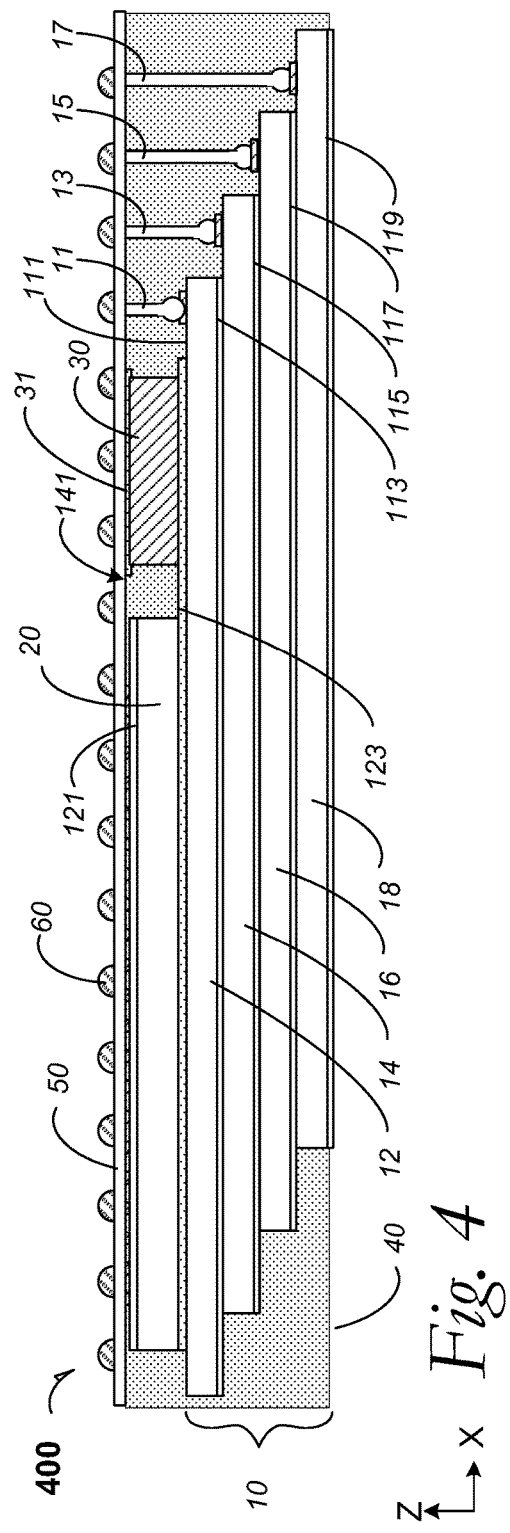

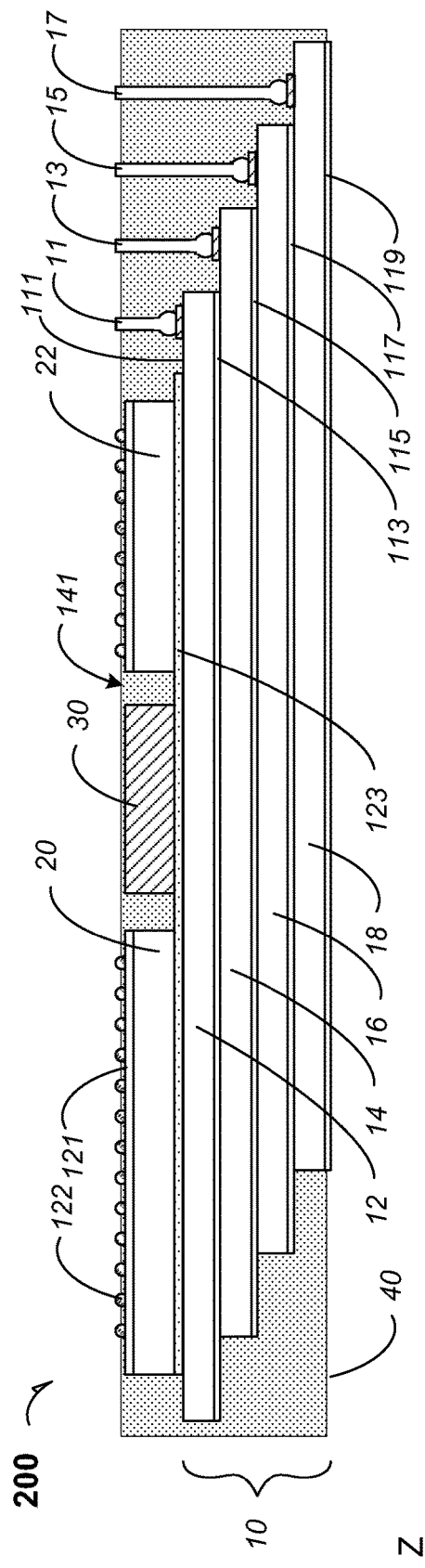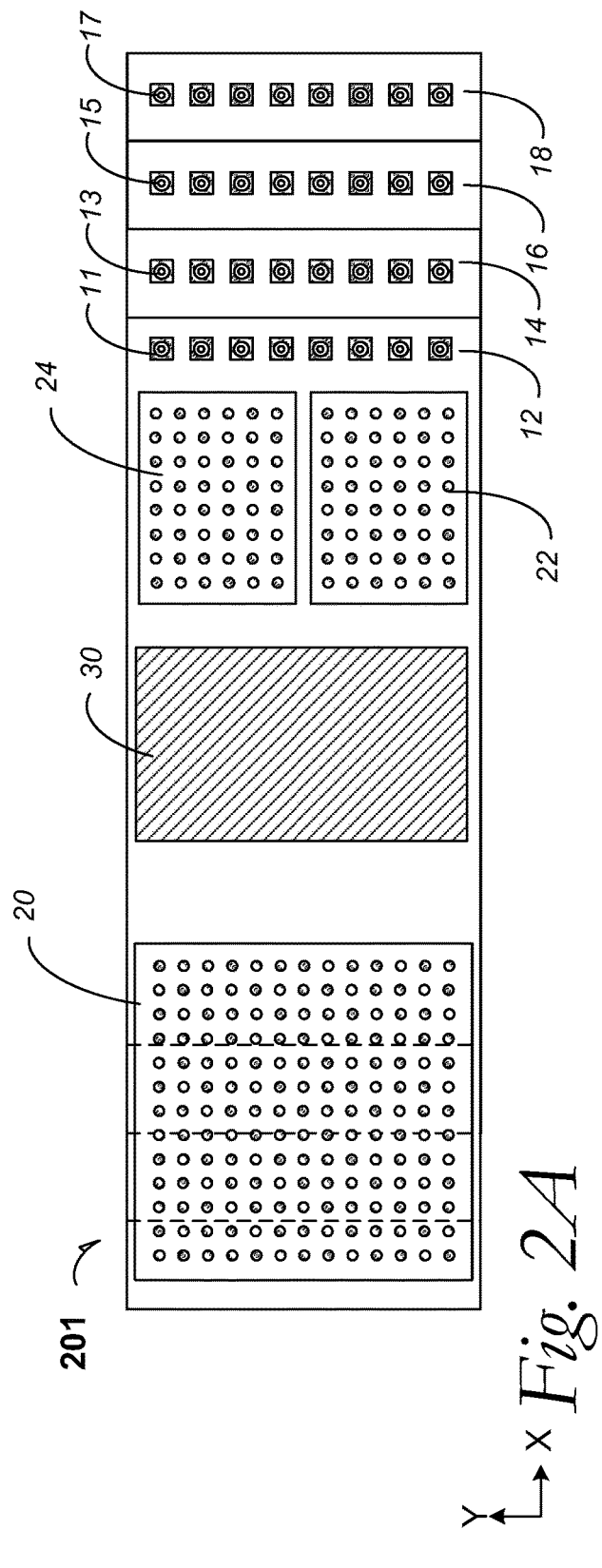

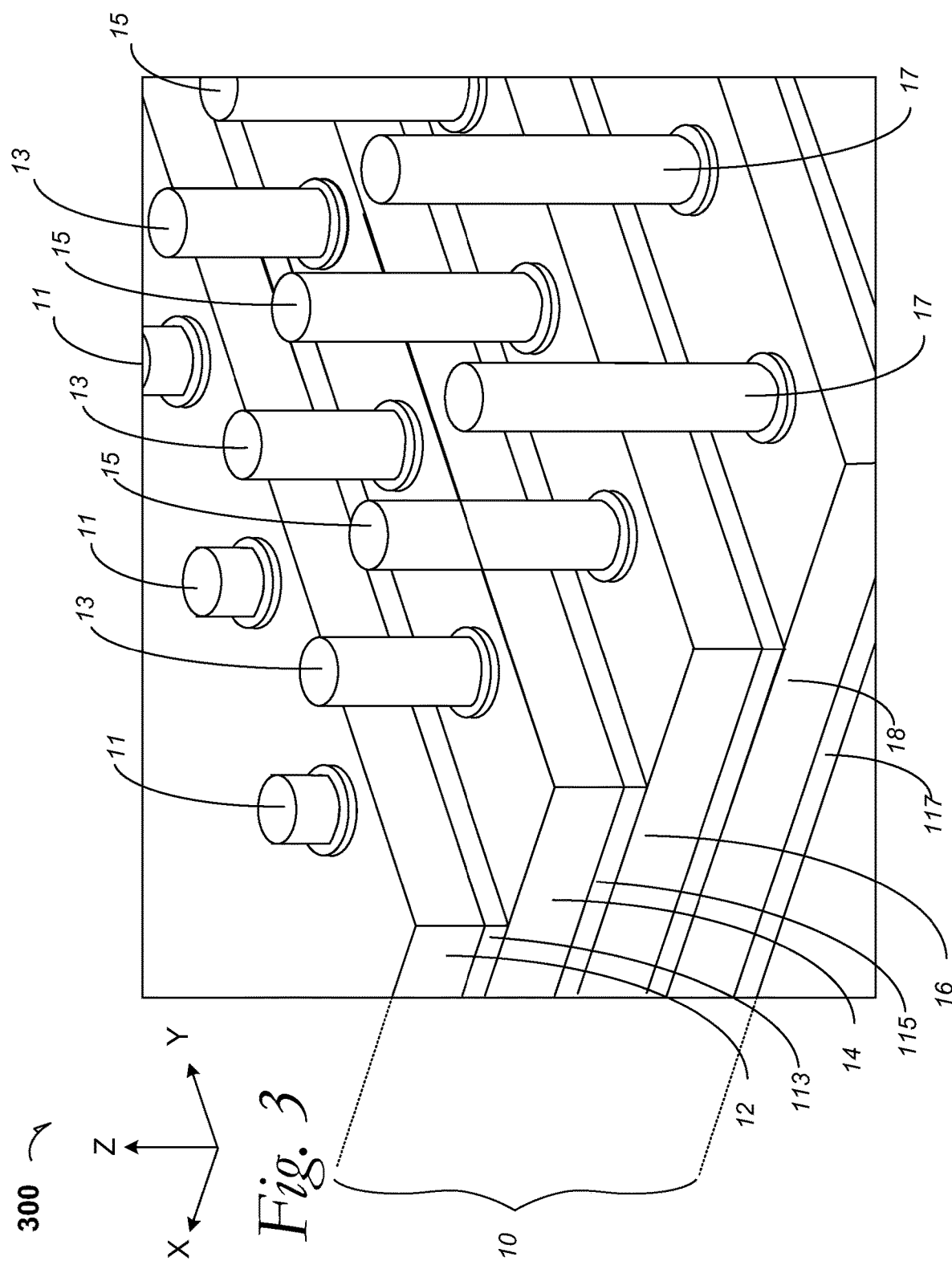

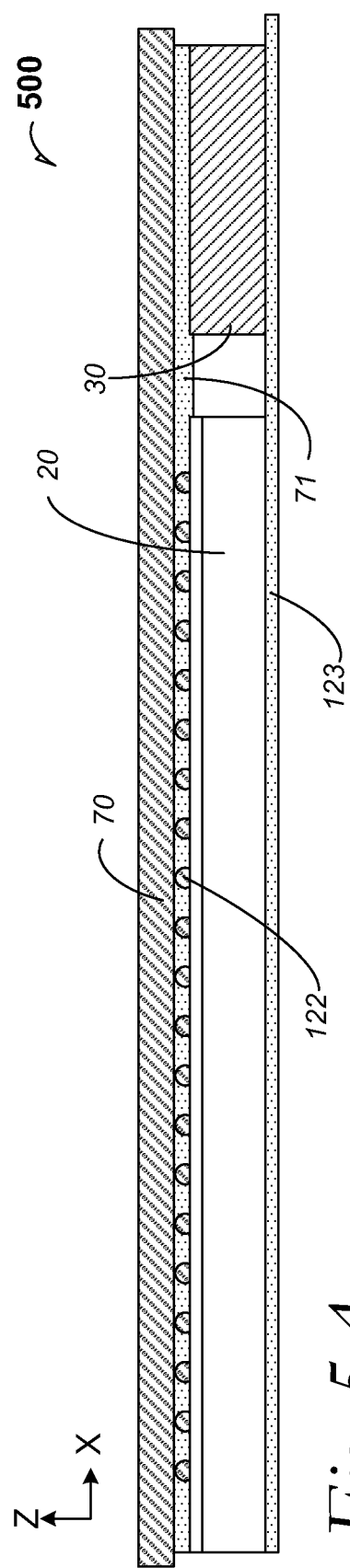

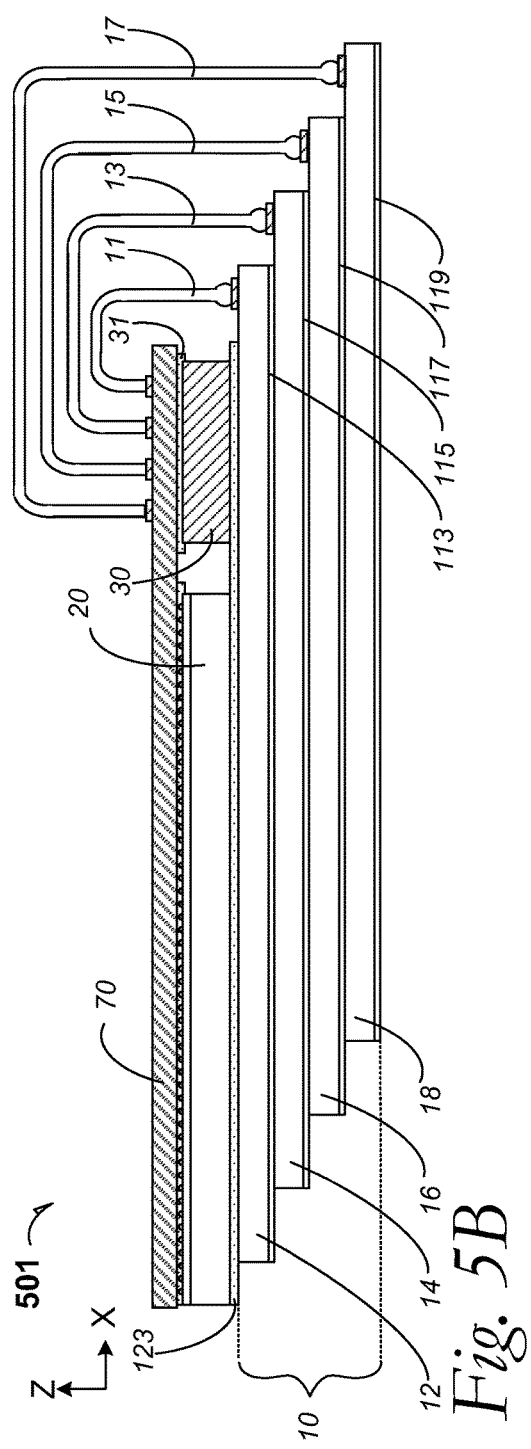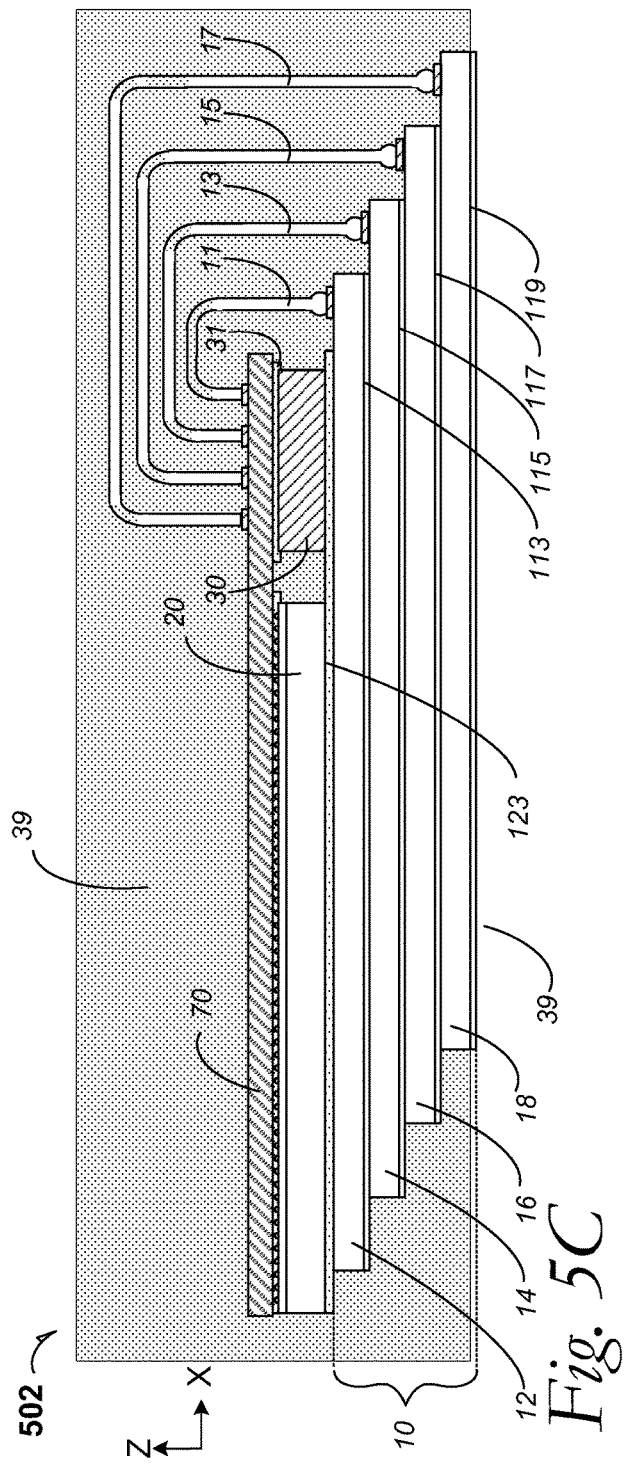

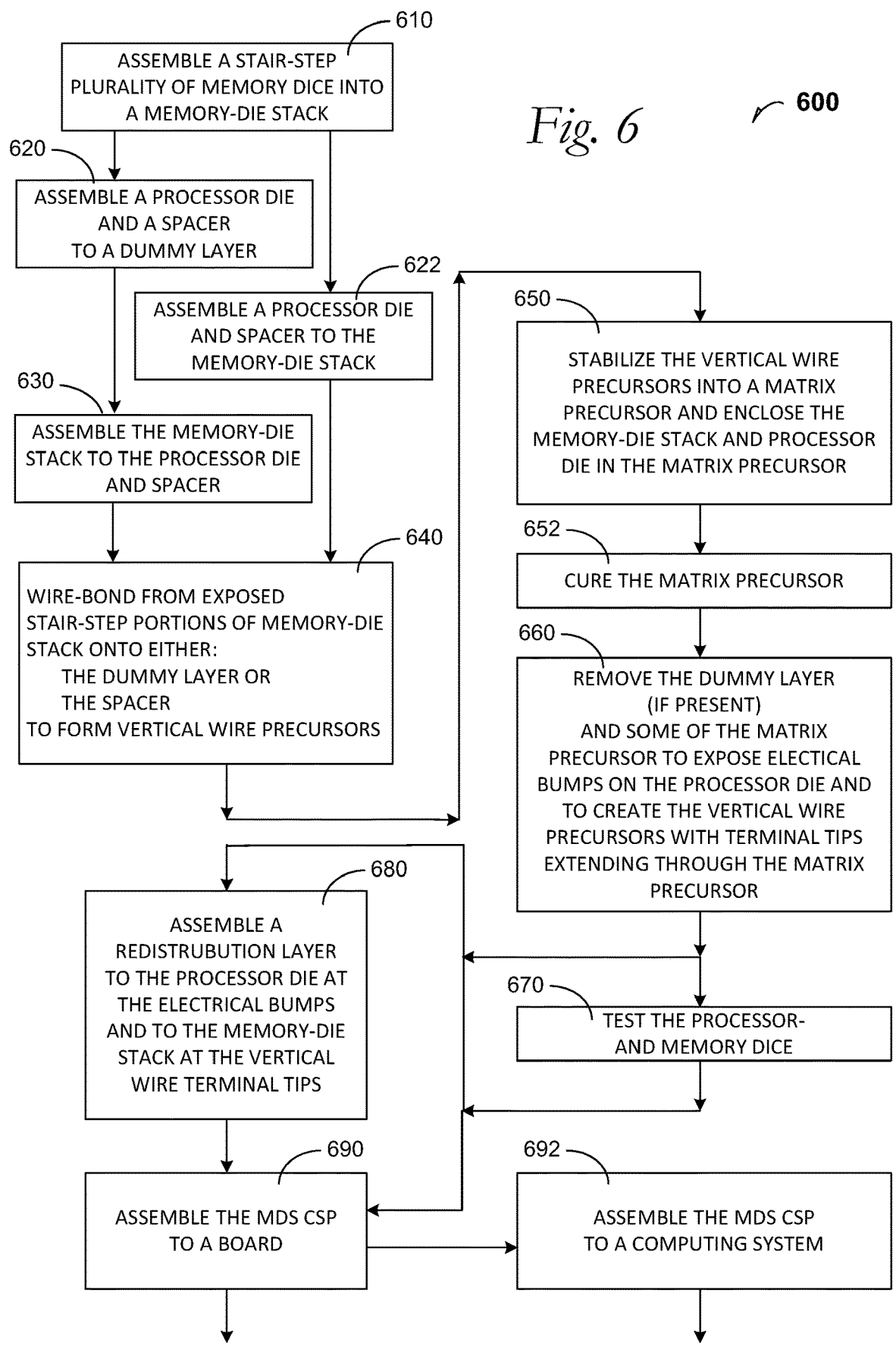

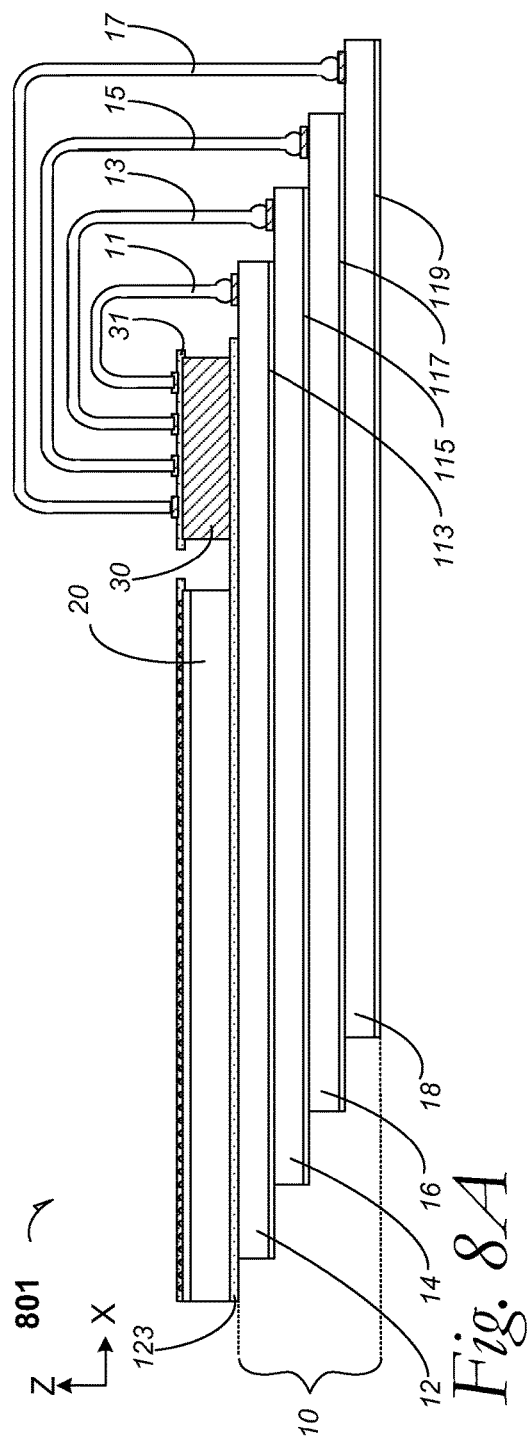
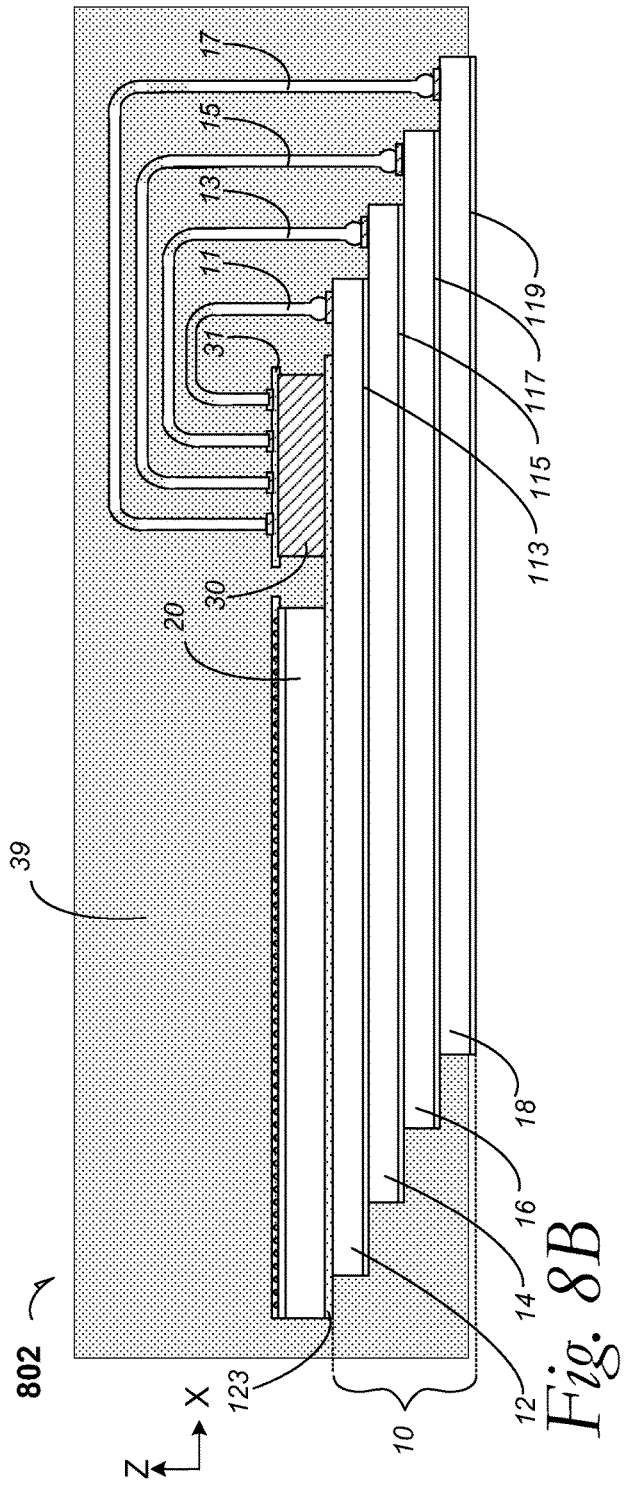

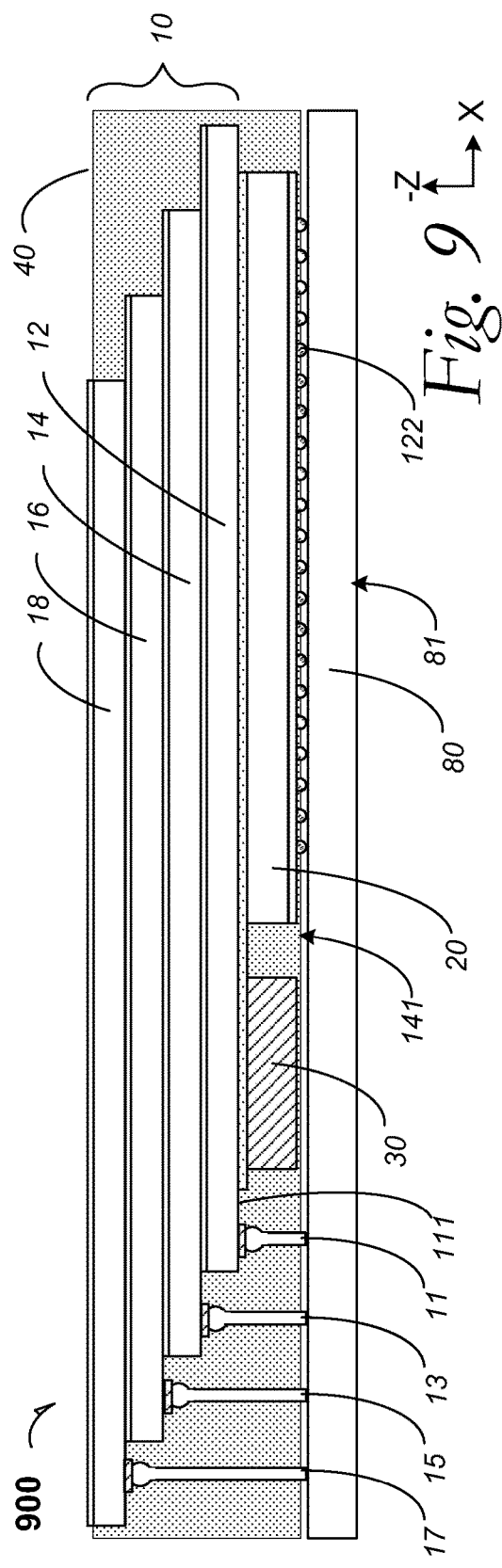
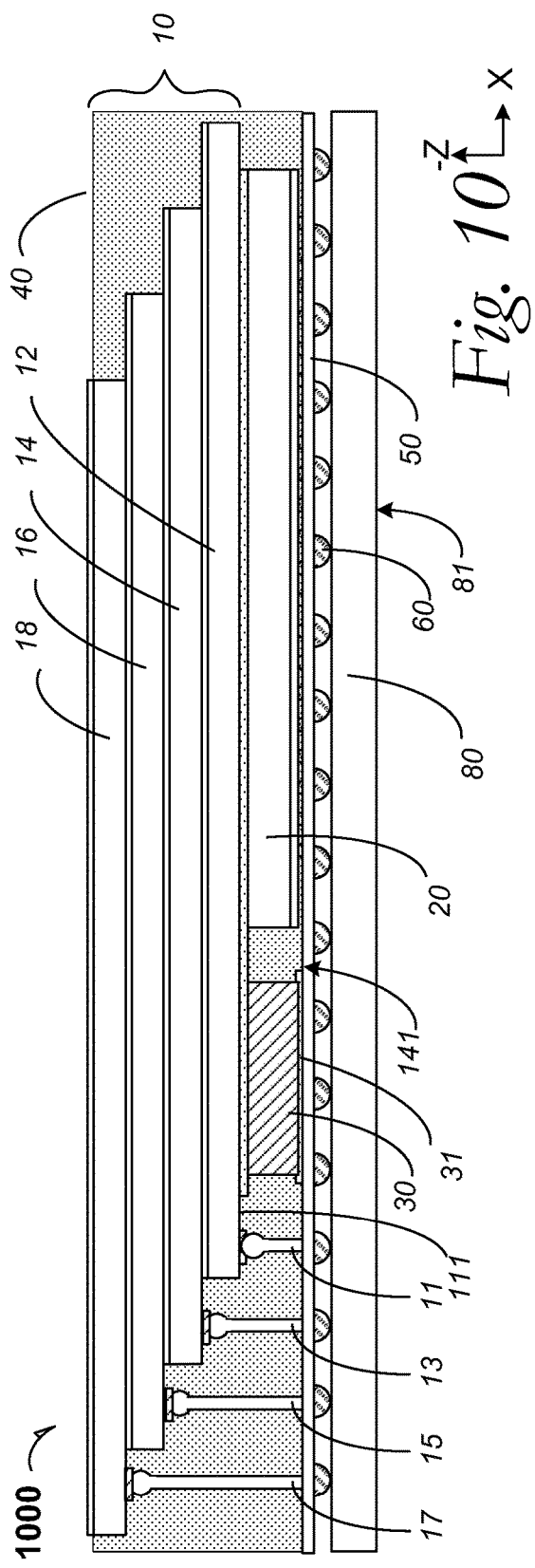

US 10,770,434 B2

STAIR-STACKED DICE DEVICE IN A SYSTEM IN PACKAGE, AND METHODS OF MAKING SAME

CLAIM OF PRIORITY

This patent application is a U.S. National Stage Application under 35 U.S.C. 371 from International Application No. PCT/CN2016/101130, filed Sep. 30, 2016, published as WO2018/058548, which is incorporated herein by reference.

FIELD

This disclosure relates to chip-scale packaging (CSP) of systems-in-package (SiP) devices including processing and memory.

BACKGROUND

Computing devices such as mobile telephones, smart phones and tablet computers are restricted in available space because there are size limitations dictated by intended use. Size reduction presents challenges for packaging.

BRIEF DESCRIPTION OF THE DRAWINGS

Various disclosed embodiments of are illustrated by way of example, and not by way of limitation, in the figures of the accompanying drawings and in which:

FIG. 1 is a cross-section elevation of a stair-stacked memory module in a system in package with vertical wire technology according to an embodiment;

FIG. 2 is a cross-section elevation of a memory-die stack chip-scale package with vertical wire technology according to an embodiment;

FIG. 2A is a top plan of a portion of the memory-die stack chip-scale package depicted in FIG. 2 according to an embodiment;

FIG. 3 is a perspective elevation detail of a portion of an SiP according to an embodiment;

FIG. 4 is a cross-section elevation of a stair-stacked memory module chip-scale package with vertical wire technology according to an embodiment;

FIG. 5A is a cross-section elevation illustrating the assembly of a processor first die to a stair-stacked memory module chip package according to a method embodiment;

FIG. 5B is a cross-section elevation of the stair-stacked memory module chip-scale package depicted in FIG. 5A after further processing according to an embodiment;

FIG. 5C is a cross-section elevation of the stair-stacked memory module chip-scale package depicted in FIG. 5B after further processing according to an embodiment;

FIG. 6 is a process flow diagram that illustrates processing embodiment;

FIG. 8A is a cross-section elevation illustrating the assembly of a processor first die to a stair-stacked memory module chip package according to a method embodiment;

FIG. 8B is a cross-section elevation of the stair-stacked memory module chip-scale package depicted in FIG. 8A after further processing according to an embodiment;

FIG. 9 is a cross-section elevation of a board-mounted stair-stacked memory module in a system in package according to an embodiment; and FIG. 10 is a cross-section elevation of a board-mounted stair-stacked memory module in a system in package according to an embodiment.

DETAILED DESCRIPTION

Figure 7:
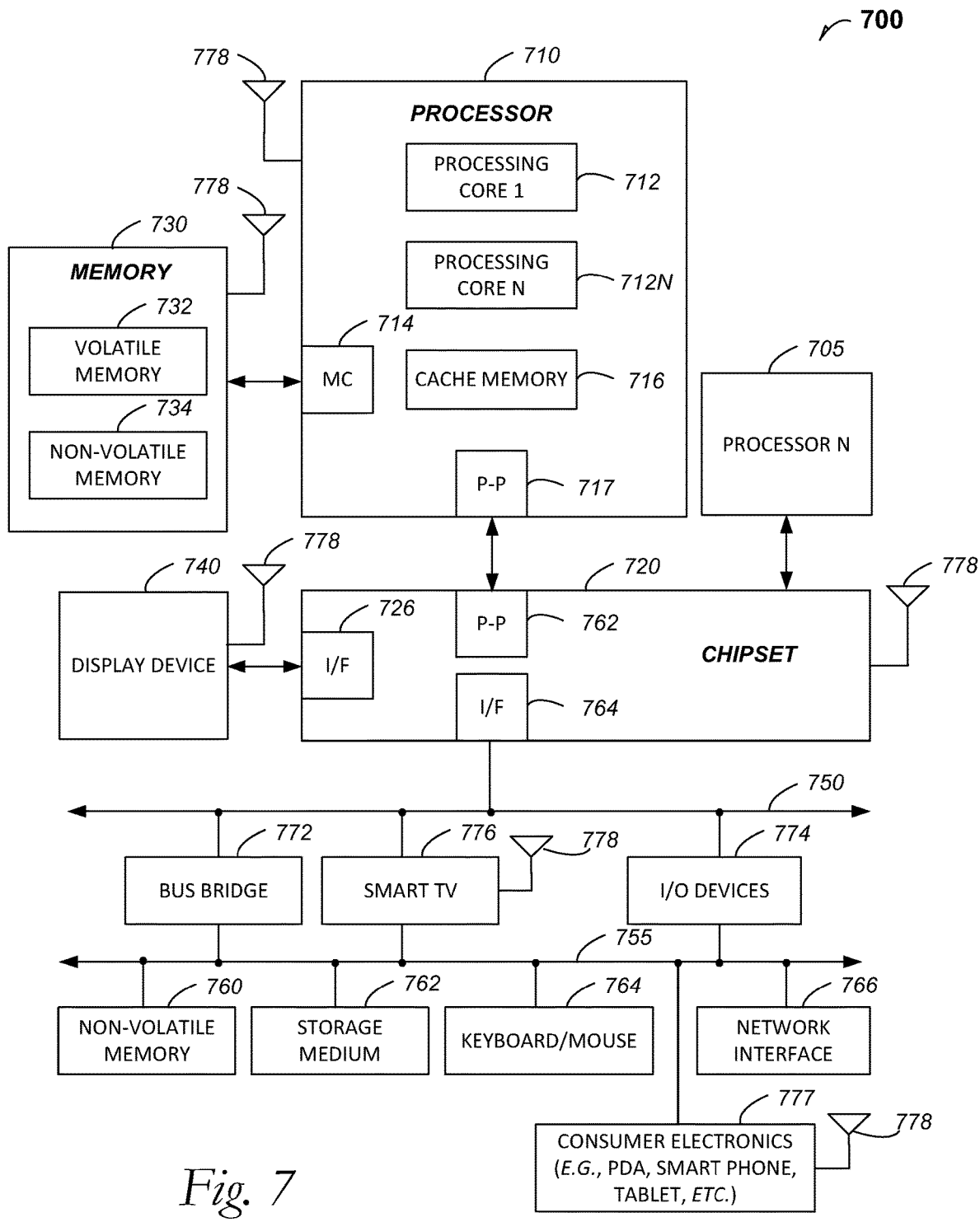
FIG. 7 is included to show an example of a higher level device application for the stair-stacked memory module SiP embodiments.

FIG. 1 is a cross-section elevation of a stair-stacked memory module (SSMM) in a system in package (SiP) 100 with vertical wire technology according to an embodiment. A memory first die 12 includes an active surface 111 and a backside surface (not indicated) that is covered with an adhesive first film 113. The memory first die 12 is fixed in a matrix 40 such as a molding material, and a first die vertical wire 11 contacts the active surface 111 and protrudes through the matrix 40 at a landing surface 141. The first die vertical wire 11 extends orthogonal from the active surface 111 of the memory first die 12. By "orthogonal" it is meant the wire 11 visually appears to be extending uniformly and directly away from the active surface 111 of the memory first die 12 to the terminal end of the wire 11. In any event, "orthogonal" may be quantified by observing the terminal end of the wire 11 protrudes above the landing surface 141 of the matrix, and the protruding end of the wire 11 has not deflected within the matrix 40 to either side in the X-direction more than the stair edge 1 of the memory first die 12 or more than the equivalent distance from the wire 11 away from the stair edge 1. In an embodiment, "orthogonal" may be quantified by observing the terminal end of the vertical wire 11 has not deflected within the matrix 40 to either side in the X-direction of the bond pad edge 2 to which the vertical bond wire 11 is bonded.

The matrix 40 may also be referred to as a package material 40. The matrix 40 may also be referred to as an encapsulation molding compound (EMC) 40 according to an embodiment.

In an embodiment, the system in package 100 includes the memory first die 12 (which is part of a stair-stacked memory module 10) stacked against a processor first die 20 at the active surface 111 by an adhesive processor-die film 123. The stair-stacked memory module 10 is seated in the matrix 40, but processing may result in a molding compound being flowed over and around the stair-stacked memory module 10 such that it may also be termed affixed in the matrix 40.

In an embodiment, the processor first die 20 is a processor die such as that made by Intel Corporation of Santa Clara, Calif. The processor first die 20 includes an active surface 121 and a backside surface that is covered by the adhesive processor-die film 123. The processor first die 20 is also seated in the matrix, but processing may result in a molding compound being flowed over and around the processor first die 20 such that it may also be termed affixed in the matrix 40.

In an embodiment, the stair-stacked memory module 10 includes four stacked memory dice including the memory first die 12, a memory second die 14, a memory third die 16, and a memory fourth die 18. Where the memory second die 14 is the last die in the stair-stacked memory module 10, it may also be referred to as a memory subsequent die 14. Similarly, where the memory third die 16 is the last die in the stair-stacked memory module 10, it may also be referred to as a memory subsequent die 16. By the same token, where the memory fourth die 18 is the last die in the stair-stacked memory module 10, it may also be referred to as a memory subsequent die 18. Hereinafter, description of the SiP 100 depicted in FIG. 1 will refer to the memory first- secondthird- and subsequent dice 12, 14, 16 and 18, respectively. It may now be understood that more than four stair-stacked memory dice may be used.

In an embodiment, the processor first die 20 is configured adjacent a spacer 30, which has a similar vertical dimension, under package-assembly conditions, to the processor first die 20. Adjustment of the vertical height of the spacer 30 may be made by a spacer adjustor 31 such as an adhesive as depicted in FIG. 4. The processor first die 20 and the spacer 30 are also seated in the matrix 40. The memory first die 12 is stacked between the processor first die 20 and the other memory dice 14, 16 and 18 in the stair-stacked memory module 10. After positioning of the memory first die 12, each following memory die 14, 16 and 18 are both stacked vertically with respect to the processor first die 20 and they are stair-stepped in the X-direction. The stair-step configuration allows respective vertical first- second- third- and subsequent memory-die wires 11, 13, 15 and 17 to have x-direction clearance: the memory first die 12 from the spacer 30, the memory second die 14 from the memory first die 12, etc. Adhesion between memory dice is accomplished by memory-die adhesives 113 for between the memory first die 12 and the memory second die 14, 115 for between the memory second die 14 and the memory third die 16, and 117 for between the memory third die 16 and the memory subsequent die 18. A memory-die subsequent adhesive 119 is depicted, but it is presented optionally depending upon processing conditions.

In an embodiment, the memory first die 12 includes an active surface 111 and a backside surface (not indicated) that is covered with an adhesive first film 113. The vertical first memory-die wire 11 communicates from the active surface 111 through the molding compound 40 to- and protrudes from the land surface 141. The processor first die 20 includes an active surface 121 and a backside surface (not indicated) that is covered with the adhesive processor-die film 123. The processor first die 20 is bumped with a processor bump array, one bump of which is indicted with reference numeral 122. It can be seen the processor bump array 122 and the vertical first memory-die wire 11 communicate through the molding compound 40 at the landing surface 141.

It may now be understood that more than four memory dice may be configured into the stair-stacked memory module 10. In an embodiment, the stair-stacked memory module 10 has five memory dice. In an embodiment, the stair-stacked memory module 10 has six memory dice. In an embodiment, the stair-stacked memory module 10 has seven memory dice. In an embodiment, the stair-stacked memory module 10 has eight memory dice. In an embodiment, the stair-stacked memory module 10 has more than eight- and fewer than or equal to 13 memory dice.

FIG. 2 is a cross-section elevation of an SiP 200 with vertical wire technology according to an embodiment. Structures depicted in FIG. 1 are also seen an enumerated similarly in FIG. 2. Additionally in an embodiment, the processor first die 20 is accompanied with a processor second die 22. In an embodiment, the processor first die 20 is a processor die such as that made by Intel Corporation of Santa Clara, Calif., and the processor second die 22 is a baseband processor for a radio-frequency processing package 200. In this embodiment, shielding of the processor second die 22 is accomplished where the spacer 30 is a metal such as aluminum, and the adhesive processor-die film 123 carries either a metal film in within, or it is sufficiently filled with metallic micro-foil sheet, scattered randomly to create a Faraday cage film 123.

It can now be understood that the processor second die 22 may be affixed in tandem (aligned in the Y-direction and not pictured) with a processor third die (e.g. see FIG. 2A).

FIG. 2A is a top plan 201 of a portion of the SiP 200 depicted in FIG. 2 according to an embodiment. The processor first die 20 and the spacer 30 are exposed and are depicted mounted upon the memory first die 12. Additionally, the processor second die 22 is mounted on the memory first die 12 as well as a processor third die 24. In an embodiment, the processor second die is a baseband processor and the processor third die 24 is an application-specific integrated circuit (ASIC) that may be selected for a useful SiP product.

FIG. 3 is a perspective elevation detail 300 of a portion of an SiP according to an embodiment. The stair-stacked memory module 10 shows first-second-third- and fourth memory dice 12, 14, 16 and 18 that are stacked in the Z-direction and are constructed in an X-direction stair-step configuration. The stair-stacked memory module 10 is assembled using an adhesion first film 113 an adhesion second film 115 and an adhesion third film 117.

It can be seen that a series of vertical first memory-die wires 11 are configured serially in the Y-direction on the first memory die 12 and they extend orthogonally away from the memory first die 12. Similarly, a series of vertical second memory-die wires 13 are configured on the second memory die 14. Likewise, a series of vertical third memory-die wires 15 are configured on the third memory die 16. And similarly, a series of vertical subsequent memory-die wires 17 are configured on the subsequent memory die 18.

FIG. 4 is a cross-section elevation of a stair-stacked memory module chip-scale package (SiP) 400 with vertical wire technology according to an embodiment. This SiP 400 is similar to the SiP 100 depicted in FIG. 1 with additional structure of a redistribution layer (RDL) 50 that has been assembled at the landing surface 141 and a land ball grid array 60 is coupled RDL 50.

The SiP 400 is configured with the RDL 50 and ball-grid array 60 to couple to a board such as a motherboard of a computing system. Adjustment of the vertical height of the spacer 30 may be made by a spacer adjustor 31 such as an adhesive.

FIG. 5A is a cross-section elevation 500 illustrating the assembly of a processor first die 20 to a stair-stacked memory module chip package according to a method embodiment. A processor first die 20 and a spacer 30 are adhered to a dummy layer 70. The dummy layer 70 is used to stabilize during assembly of the processor first die 20 as well as the spacer 30. In an embodiment, the dummy layer 70 is an aluminum material or some other material that is sufficiently rigid during assembly to provide a useful rigid base. The dummy layer 70 is seated onto the processor first die 20 and the spacer 30 with an adhesive 71 such as a dielectric material. An adhesive processor-die film 123 is also affixed in anticipation of assembly to a stair-stacked memory module 10 as is illustrated hereinafter.

FIG. 5B is a cross-section elevation 501 of the stair-stacked memory module chip-scale package 500 depicted in FIG. 5A after further processing according to an embodiment. During processing, a stair-stacked memory module 10 is assembled onto a processor first die 20 and spacer 30 by adhering at the adhesive processor-die film 123. Similar to the stair-stacked memory module 10 depicted in FIG. 3, the stair-stacked memory module 10 includes a subsequent memory die 18 and a subsequent adhesive layer 119 that may be used to stabilize the stack 10 during stack assembly.

It can be seen that respective vertical first- second- third- and subsequent memory-die wires 11, 13, 15 and 17 are anchored at their respective memory dice 12, 14, 16 and 18, but they are also vertically wire-loop anchored to a dummy layer 70. The dummy layer 70 is used to stabilize the loop-anchored vertical wires 11, 13, 15 and 17 as well as to stabilize the assembly of the stair-stacked memory module 10 and the first processor die 20 as well as the spacer 30. In an embodiment, the dummy layer 70 is an aluminum material or some other material that is sufficiently rigid during assembly to provide strengthened loop-anchored wires 11, 13, 15 and 17. The dummy layer 70 also is seated onto the processor first die 20 and the spacer 30 with an adhesive 31 such as a dielectric material. The adhesive 31 may be configured to release by thermal-release processing, or it may be dissolved after backgrinding of the matrix as will be further illustrated.

FIG. 5C is a cross-section elevation 502 of the stair-stacked memory module chip-scale package 501 depicted in FIG. 5B after further processing according to an embodiment. A matrix precursor 39 has been formed over the stair-stacked memory module 10 and the processor first die 20 as well as the spacer 30 and the dummy layer 70. The loop-anchored vertical wires 11, 13, 15 and 17 are also affixed in the matrix precursor 30, but movement of the vertical portions is resisted by their loop-anchored configuration at the dummy layer 70. The loop-anchored wires may be variously bent for attachment to the memory dice and the dummy layer 70 to facilitate few- or no shorting between wires during assembly.

In an embodiment, the matrix precursor 39 is assembled to the various structures. In an embodiment, selected spray depositing of matrix precursor 39 is first done to fill into spaces that may be too tight for useful bulk overmolding conditions, followed by injection molding of more matrix precursor material 39.

Further processing may be understood by reference to FIGS. 1 and 2. After achieving a structure with the matrix precursor 39 (see FIG. 5C) being cured into the matrix 40 (see FIGS. 1 and 2), the structures represented in FIGS. 1 and 2 can be achieved by stripping away the dummy layer 70 and by grinding the EMC 40 and eventually approaching exposure of the bump array 122.

Also by grinding to this extent, the formerly loop-anchored wires 11, 13, 15 and 17 depicted in FIG. 5C are reduced in size to approach the vertical wires 11, 13, 15 and 17 depicted in FIGS. 1 and 2. Because of useful rigidity of the EMC 40 and as the loop-anchored wires are reduced to vertical wires, the EMC 40 holds the wires in place and resists the vertical portions from deflecting.

In an embodiment as grinding approaches a useful endpoint, removing more EMC 40 is done by chemical etching. The chemical etching may be done by chemical-mechanical polishing (CMP) where etch solvents are selective to leaving metallic materials such as the bump array 122 and the terminal ends of the vertical wires 11, 13, 15 and 17 such that both the bumps of the bump array 122 and the terminal ends of the vertical wires 11, 13, 15 and 17 protrude from the EMC 40 as illustrated in FIGS. 1 and 2. In an embodiment, etching is done alone without mechanical polishing.

In an embodiment, testing of the assembled SIP 100 or the SIP 200 may be done where bumps 122 and vertical wires 11, 13, 15 and 17 are exposed. Since a useful number- and type of bumps 122 and vertical wires 11, 13, 15 and 17 are exposed, testing can be carried out on all of the illustrated devices including the processor first die 20 and the several stacked memory dice 12, 14, 16 and 18. Where more dice are present at the level of the processor first die 20, they also may be tested before further packaging. Testing methods may include placing an individual probe onto a selected bump in the bump array 122, as well as placing an individual probe onto a selected vertical wire from any of the vertical wires 11, 13, 15 and 17 as they are exposed at their terminal ends above the landing surface 141.

After testing is completed and a useful yield has been confirmed, an RDL 50 (see FIG. 4) may be fabricated to couple the processor 20 with the dice in the stair-stacked memory module 10.

FIG. 6 is a process flow diagram that illustrates processing embodiment.

At 610, the process includes assembling a stair-step plurality of memory dice into a stair-stacked memory module. In a non-limiting example embodiment, the stair-stacked memory module 300 depicted in FIG. 3 (without the vertical wires) is assembled.

At 620, the process includes assembling a processor die and a spacer to a dummy layer. In a non-limiting example embodiment, the processor first die 20 and the spacer 30 depicted in FIG. 5A are assembled to the dummy layer 70 by using a dielectric adhesive 71. In a non-limiting example embodiment, the dielectric adhesive 71 is affixed to the dummy layer 70 and pick-and-place technology is used to assemble the processor first die 20 and the spacer 30. In a non-limiting example embodiment, the processor first die 20 and the processor second die 22 are assembled with the spacer 30 as illustrated in FIG. 2, but they are also assembled with a dummy layer and dielectric adhesive (not pictured), similarly as depicted in FIG. 5A.

At 630, the process includes assembling the stair-stacked memory module to the processor and spacer. In a non-limiting example embodiment, the adhesive processor-die film 123 is used to assemble the stair-stacked memory module 10 to the dummy layer 70, the processor first die 20 and to the spacer 30.

At 640, the process includes loop-bonding the vertical bond wire precursors between respective first-to-subsequent memory dice and onto the dummy layer. In a non-limiting example embodiment, the looped wirebonding depicted in FIG. 5B is accomplished between the first-through subsequent memory dice 12 through 18 and the dummy layer 70.

At 650, the process includes stabilizing the vertical wire precursors into a matrix precursor, and enclosing the stair-stacked memory module and the processor die in the matrix precursor. In a non-limiting example embodiment, the matrix precursor 39 is injection molded over the pertinent structures as depicted in FIG. 5C.

At 652, the process includes curing the matrix precursor. In a non-limiting example embodiment, the matrix precursor 39 is thermally cured such as is useful for a dielectric epoxy material. In a non-limiting example embodiment, the matrix precursor 39 is thermal- and light cured where a useful spectrum of light energy cures and cross-links organic materials.

At 660, the process includes removing the dummy layer and grinding sufficient of the cured matrix to expose the electrical bumps on the processor first die and to achieve vertical wires in the matrix.

At 670, a method embodiment includes testing the processor- and memory dice. In a non-limiting example embodiment, testing of the assembled SiP 100 or the SiP 200 may be done where bumps 122 and vertical wires 11, 13, 15 and 17 are exposed.

At 680, the process includes assembling a redistribution layer to the processor die at the electrical bumps and to the stair-stacked memory module at the vertical wire terminal tips.

At 690, the process includes assembling the SiP to a board. In a non-limiting example embodiment, the SiP 100 is assembled to a board such as a motherboard. In a non-limiting example embodiment, the SiP 200 is assembled to a board such as a motherboard. It can be seen that the SiP may be assembled to a board without the use of an RDL (see, e.g., FIG. 8).

At 692, the process includes assembling the SiP to a computing system. In a non-limiting example embodiment, the SiP 100 is assembled to a board such as a motherboard and then to a computing system such as that depicted and described in FIG. 6. In a non-limiting example embodiment, the SiP 200 is assembled to a board such as a motherboard and then to a computing system such as that depicted and described in FIG. 6.

FIG. 7 is a computing system 700 according to an embodiment. FIG. 7 illustrates a system level diagram, according to one embodiment of the invention. For instance, FIG. 7 depicts an example of a microelectronic device that includes an SEI embodiment on a substrate such as a flexible substrate as described in the present disclosure.

FIG. 7 is included to show an example of a higher level device application for the stair-stacked memory module SiP embodiments. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the stair-stacked memory module SiP is part of a computing system 700.

In an embodiment, the processor 710 has one or more processing cores 712 and 712N, where 712N represents the Nth processor core inside processor 710 where N is a positive integer. In an embodiment, the electronic device system 700 using an SEI interconnect includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the stair-stacked memory module SiP computing system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a semiconductive bridge as set forth in this disclosure. The chipset 720 enables the processor 710 to connect to other elements in the SiP device system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a single SOC such as selected stair-stacked memory module SiP embodiments described herein. Additionally, the chipset 720 connects to one or more buses 750 and 755 that interconnect various elements 774, 760, 762, 764, and 766. Buses 750 and 755 may be interconnected together via a bus bridge 772. In an embodiment, the chipset 720 couples with a non-volatile memory 760, a mass storage device(s) 662, a keyboard/mouse 664, and a network interface 766 by way of at least one of the interface 724 and 704, the smart TV 776, and the consumer electronics 777, etc.

In and embodiment, the mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the stair-stacked memory module SiP computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

FIG. 8A is a cross-section elevation 801 of a stair-stacked memory module chip-scale package 801 according to a processing embodiment. During processing, a stair-stacked memory module 10 is assembled onto a processor first die 20 and spacer 30 by adhering at the adhesive processor-die film 123. Similar to the stair-stacked memory module 10 depicted in FIG. 3, the stair-stacked memory module 10 includes a subsequent memory die 18 and a subsequent adhesive layer 119 that may be used to stabilize the stack 10 during stack assembly.

It can be seen that respective vertical first- second- third- and subsequent memory-die wires 11, 13, 15 and 17 are anchored at their respective memory dice 12, 14, 16 and 18, but they are also vertically wire-loop anchored to a dummy layer 70. The spacer is used to stabilize the loop-anchored vertical wires 11, 13, 15 and 17 as well as to stabilize the assembly of the stair-stacked memory module 10 and the first processor die 20 as well as the spacer 30. In an embodiment, the spacer 30 is an aluminum material or some other material that is sufficiently rigid during assembly to provide strengthened loop-anchored wires 11, 13, 15 and 17. The spacer 30 also is seated onto the memory first die 12 alongside the processor first die 20 with an adhesive 31 such as a dielectric material. The adhesive 31 may be configured to release by thermal-release processing, or it may be dissolved after backgrinding of the matrix as will be further illustrated.

FIG. 8B is a cross-section elevation 802 of the stair-stacked memory module chip-scale package 801 depicted in FIG. 8A after further processing according to an embodiment. A matrix precursor 39 has been formed over the stair-stacked memory module 10 and the processor first die 20 as well as the spacer 30. The loop-anchored vertical wires 11, 13, 15 and 17 are also affixed in the matrix precursor 30, but movement of the vertical portions is resisted by their loop-anchored configuration at the spacer 30. The loop-anchored wires may be variously bent for attachment to the memory dice and the spacer 30 to facilitate few- or no shorting between wires during assembly.

In an embodiment, the matrix precursor 39 is assembled to the various structures. In an embodiment, selected spray depositing of matrix precursor 39 is first done to fill into spaces that may be too tight for useful bulk overmolding conditions, followed by injection molding of more matrix precursor material 39.

Further processing may be understood by reference to FIGS. 1 and 2. After achieving a structure with the matrix precursor 39 (see FIG. 8B) being cured into the matrix 40 (see FIGS. 1 and 2), the structures represented in FIGS. 1 and 2 can be achieved by grinding the EMC 40 and eventually approaching exposure of the bump array 122.

Also by grinding to this extent, the formerly loop-anchored wires 11, 13, 15 and 17 depicted in FIG. 8B are reduced in size to approach the vertical wires 11, 13, 15 and 17 depicted in FIGS. 1 and 2. Because of useful rigidity of the EMC 40 and as the loop-anchored wires are reduced to vertical wires, the EMC 40 holds the wires in place and resists the vertical portions from deflecting.

In an embodiment as grinding approaches a useful endpoint, removing more EMC 40 is done by chemical etching. The chemical etching may be done by chemical-mechanical polishing (CMP) where etch solvents are selective to leaving metallic materials such as the bump array 122 and the terminal ends of the vertical wires 11, 13, 15 and 17 such that both the bumps of the bump array 122 and the terminal ends of the vertical wires 11, 13, 15 and 17 protrude from the EMC 40 as illustrated in FIGS. 1 and 2. In an embodiment, etching is done alone without mechanical polishing.

In an embodiment, testing of the assembled SIP 100 or the SIP 200 may be done where bumps 122 and vertical wires 11, 13, 15 and 17 are exposed. Since a useful number- and type of bumps 122 and vertical wires 11, 13, 15 and 17 are exposed, testing can be carried out on all of the illustrated devices including the processor first die 20 and the several stacked memory dice 12, 14, 16 and 18. Where more dice are present at the level of the processor first die 20, they also may be tested before further packaging. Testing methods may include placing an individual probe onto a selected bump in the bump array 122, as well as placing an individual probe onto a selected vertical wire from any of the vertical wires 11, 13, 15 and 17 as they are exposed at their terminal ends above the landing surface 141.

After testing is completed and a useful yield has been confirmed, an RDL 50 (see FIG. 4) may be fabricated to couple the processor 20 with the dice in the stair-stacked memory module 10.

FIG. 9 is a cross-section elevation of a board-mounted stair-stacked memory module in a system in package 900 according to an embodiment. A board 80 such as a motherboard has been electrically and physically mated to an SSMM 10 and a processor first die 20. The vertical bond wires 11, 13, 15 and 17 extend orthogonally toward- and are coupled to the board 80 and a processor bump array 122 is also coupled to the board 80. In an embodiment, the board 80 is a motherboard of a computing system. In an embodiment, the board 80 includes a redistribution layer, but it also includes the outer shell 81 of a computing system such as a mobile computing device.

FIG. 10 is a cross-section elevation of a board-mounted stair-stacked memory module in a system in package 1000 according to an embodiment. A board 80 such as a motherboard has been electrically and physically mated to an SSMM 10 and a processor first die 20 through a redistribution layer (RDL) 50. The vertical bond wires 11, 13, 15 and 17 extend orthogonally toward- and are coupled to the board 80 through the RDL 50 and a processor bump array 122 is also coupled to the board 80 through the RDL 50. In an embodiment, the board 80 is a motherboard of a computing system. In an embodiment, the board 80 also includes the outer shell 81 of a computing system such as a mobile computing device.

To illustrate the electronic assemblies, electronic packages and methods disclosed herein, a non-limiting list of examples is provided herein:

Example 1 is a stair-stepped memory module in a system in package comprising: a matrix including a landing surface; a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface; a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface; a spacer disposed on the memory first die, and wherein the spacer is disposed between the processor first die and the memory first die vertical bond wire.

In Example 2, the subject matter of Example 1 optionally includes wherein the first bond wire extends orthogonally away from the memory first die active surface, and wherein the subsequent bond wire extends orthogonally away from the memory subsequent die active surface.

In Example 3, the subject matter of any one or more of Examples 1-2 optionally include a memory second die disposed on the memory first die active surface and between the memory first die and the memory subsequent die, and a second bond wire disposed on the memory second die, wherein the second bond wire extends orthogonally away from the memory second die.

In Example 4, the subject matter of any one or more of Examples 1-3 optionally include a memory second die disposed on the memory first die active surface and between the memory first die and the memory subsequent die; and a memory third die disposed on the memory second die active surface and between the memory second die and the memory subsequent die.

In Example 5, the subject matter of any one or more of Examples 1-4 optionally include a memory second die disposed on the memory first die active surface and between the memory first die and the memory subsequent die; and a memory third die disposed on the memory second die active surface and between the memory second die and the memory subsequent die, and wherein the memory third die is disposed on the memory subsequent die.

In Example 6, the subject matter of any one or more of Examples 1-5 optionally include a redistribution layer that contacts the processor bump array and the memory first die vertical bond wire and the memory subsequent die vertical bond wire; and a ball-grid array disposed on the redistribution layer.

In Example 7, the subject matter of Example 6 optionally includes wherein the first bond wire extends orthogonally away from the memory first die active surface, and wherein the subsequent bond wire extends orthogonally away from the memory subsequent die active surface.

In Example 8, the subject matter of any one or more of Examples 6-7 optionally include a memory second die disposed on the memory first die active surface and between the memory first die and the memory subsequent die. In Example 9, the subject matter of any one or more of Examples 6-8 optionally include a memory second die disposed on the memory first die active surface and between the memory first die and the memory subsequent die; and a memory third die disposed on the memory second die active surface and between the memory second die and the memory subsequent die.

In Example 10, the subject matter of any one or more of Examples 1-9 optionally include a memory second die disposed on the memory first die active surface and between the memory first die and the memory subsequent die; and a memory third die disposed on the memory second die active surface and between the memory second die and the memory subsequent die, and wherein the memory third die is disposed on the memory subsequent die.

In Example 11, the subject matter of any one or more of Examples 1-10 optionally include wherein the spacer is a metal, further including a processor second die disposed on the memory first die and at least partially seated in the matrix, the processor second die including an active surface and a backside surface, wherein a processor bump array is disposed on the processor second die active surface, and wherein the processor bump array extends at least partially away from the matrix landing surface.

In Example 12, the subject matter of Example 11 optionally includes wherein the processor second die is a baseband processor.

Example 13 is a method of testing a system in package, comprising: applying a test probe to a bump in a bump array of a processor first die that is seated in a matrix, the matrix including a landing surface, and the matrix also containing a stair-stacked memory module including a memory first die and a memory subsequent die; applying a test probe to a first vertical bond wire terminal end that extends above the matrix at the landing surface, wherein memory first die includes an active surface and a backside surface and the memory subsequent die including an active surface and a backside surface, wherein the memory first die includes the vertical first bond wire that extends from the memory first die active surface, and the memory subsequent die includes a subsequent vertical bond wire that extends from the memory subsequent die active surface and breaches the matrix landing surface.

In Example 14, the subject matter of Example 13 optionally includes wherein testing includes testing the memory first die, a memory second die, and the memory subsequent die, further including following achieving a testing yield: assembling a redistribution layer to the processor first die and the memory first die, the memory second die, and the memory subsequent die.

In Example 15, the subject matter of any one or more of Examples 13-14 optionally include wherein testing includes testing the memory first die, a memory second die, and the memory subsequent die, further including following achieving a testing yield: assembling a board to the processor first die and the memory first die, the memory second die, and the memory subsequent die.

Example 16 is a method of assembling a system in package, comprising: assembling a stair-stacked memory module to a processor first die and a spacer; assembling a dummy layer above the processor first die and the spacer; wirebonding a plurality of memory dice from the stair-stacked memory module wherein at least a one bond wire spans between the memory first die the dummy layer; with a matrix material precursor, overmolding the processor first die, the spacer, the dummy layer, and the stair-stacked memory module under conditions to partially encapsulate the bond wire; removing the dummy layer; removing a portion of the matrix material under conditions to reduce the bond wire to a vertical bond wire and to expose an electrical bump that is part of a bump array on the processor first die.

In Example 17, the subject matter of Example 16 optionally includes wherein the stair-stacked memory module includes a memory first die with an active surface and a backside surface and a memory subsequent die including an active surface and a backside surface, wherein the memory first die includes the at least one bond wire that is configured as a vertical first bond wire, further including a subsequent vertical bond wire that extends from the memory subsequent die active surface, wherein removing a portion of the matrix includes first grinding the matrix followed by etching the matrix to arrive at a landing surface.

In Example 18, the subject matter of any one or more of Examples 16-17 optionally include wherein following overmolding, the process includes curing the matrix material precursor.

In Example 19, the subject matter of any one or more of Examples 16-18 optionally include wherein following overmolding, the process includes curing the matrix material precursor, the mother further including: assembling a redistribution layer to contact the processor bump array and the memory first die vertical bond wire and the memory subsequent die vertical bond wire; and assembling a ball-grid array on the redistribution layer.

Example 20 is a computing system including a stair-stepped memory module in a system in package comprising a board, and mounted on the board: a matrix including a landing surface; a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface; a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface; a spacer disposed on the memory first die, and wherein the spacer is disposed between the processor first die and the memory first die vertical bond wire.

In Example 21, the subject matter of Example 20 optionally includes a redistribution layer that contacts the processor bump array and the memory first die vertical bond wire and the memory subsequent die vertical bond wire; and a ball-grid array disposed on the redistribution layer, and wherein the redistribution layer is disposed between the processor first die, the spacer and the board.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A stair-stepped memory module in a system in package comprising:
   a matrix including a landing surface;
   a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface;
   a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface;
   a spacer disposed on the memory first die, and wherein the spacer is disposed between the processor first die and the memory first die vertical bond wire.

2. The stair-stepped memory module of claim 1, wherein the first bond wire extends orthogonally away from the memory first die active surface, and wherein the subsequent bond wire extends orthogonally away from the memory subsequent die active surface.

3. The stair-stepped memory module of claim 1, further including a memory second die disposed on the memory first die active surface and between the memory first die and the memory subsequent die, and a second bond wire disposed on the memory second die, wherein the second bond wire extends orthogonally away from the memory second die.

4. The stair-stepped memory module of claim 1, further including:
   a memory second die disposed on the memory first die active surface and between the memory first die and the memory subsequent die; and
   a memory third die disposed on the memory second die active surface and between the memory second die and the memory subsequent die.

5. The stair-stepped memory module of claim 1, further including:
   a memory second die disposed on the memory first die active surface and between the memory first die and the memory subsequent die; and
   a memory third die disposed on the memory second die active surface and between the memory second die and the memory subsequent die, and wherein the memory third die is disposed on the memory subsequent die.

6. The stair-stepped memory module of claim 1, further comprising:
   a redistribution layer that contacts the processor bump array and the memory first die vertical bond wire and the memory subsequent die vertical bond wire; and
   a ball-grid array disposed on the redistribution layer.

7. The stair-stepped memory module of claim 6, wherein the first bond wire extends orthogonally away from the memory first die active surface, and wherein the subsequent bond wire extends orthogonally away from the memory subsequent die active surface.

8. The stair-stepped memory module of claim 6, further including a memory second die disposed on the memory first die active surface and between the memory first die and the memory subsequent die.

9. The stair-stepped memory module of claim 6, further including:
   a memory second die disposed on the memory first die active surface and between the memory first die and the memory subsequent die; and
   a memory third die disposed on the memory second die active surface and between the memory second die and the memory subsequent die.

10. The stair-stepped memory module of claim 1, further including:
    a memory second die disposed on the memory first die active surface and between the memory first die and the memory subsequent die; and
    a memory third die disposed on the memory second die active surface and between the memory second die and the memory subsequent die, and wherein the memory third die is disposed on the memory subsequent die.

11. The stair-stepped memory module of claim 1, wherein the spacer is a metal, further including a processor second die disposed on the memory first die and at least partially seated in the matrix, the processor second die including an active surface and a backside surface, wherein a processor bump array is disposed on the processor second die active surface, and wherein the processor bump array extends at least partially away from the matrix landing surface.

12. The stair-stepped memory module of claim 11, wherein the processor second die is a baseband processor.

13. A method of testing a system in package, comprising:
    applying a test probe to a bump in a bump array of a processor first die that is seated in a matrix, the matrix including a landing surface, and the matrix also containing a stair-stacked memory module including a memory first die and a memory subsequent die;
    applying a test probe to a first vertical bond wire terminal end that extends above the matrix at the landing surface, wherein memory first die includes an active surface and a backside surface and the memory subsequent die including an active surface and a backside surface, wherein the memory first die includes the vertical first bond wire that extends from the memory first die active surface, and the memory subsequent die includes a subsequent vertical bond wire that extends from the memory subsequent die active surface and breaches the matrix landing surface.

14. The method of claim 13, wherein testing includes testing the memory first die, a memory second die, and the memory subsequent die, further including following achieving a testing yield:
    assembling a redistribution layer to the processor first die and the memory first die, the memory second die, and the memory subsequent die.

15. The method of claim 13, wherein testing includes testing the memory first die, a memory second die, and the memory subsequent die, further including following achieving a testing yield:
    assembling a board to the processor first die and the memory first die, the memory second die, and the memory subsequent die.

16. A method of assembling a system in package, comprising:
    assembling a stair-stacked memory module to a processor first die and a spacer;
    assembling a dummy layer above the processor first die and the spacer;
    wirebonding a plurality of memory dice from the stair-stacked memory module wherein at least a one bond wire spans between the memory first die the dummy layer;
    with a matrix material precursor, overmolding the processor first die, the spacer, the dummy layer, and the stair-stacked memory module under conditions to partially encapsulate the bond wire;
    removing the dummy layer;
    removing a portion of the matrix material under conditions to reduce the bond wire to a vertical bond wire and to expose an electrical bump that is part of a bump array on the processor first die.

17. The method of claim 16, wherein the stair-stacked memory module includes a memory first die with an active surface and a backside surface and a memory subsequent die including an active surface and a backside surface, wherein the memory first die includes the at least one bond wire that is configured as a vertical first bond wire, further including a subsequent vertical bond wire that extends from the memory subsequent die active surface, wherein removing a portion of the matrix includes first grinding the matrix followed by etching the matrix to arrive at a landing surface.

18. The method of claim 16, wherein following overmolding, the process includes curing the matrix material precursor.

19. The method of claim 16, wherein following overmolding, the process includes curing the matrix material precursor, the mother further including:
    assembling a redistribution layer to contact the processor bump array and the memory first die vertical bond wire and the memory subsequent die vertical bond wire; and
    assembling a ball-grid array on the redistribution layer.

20. A computing system including a stair-stepped memory module in a system in package comprising a board, and mounted on the board:

a matrix including a landing surface;

a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface;

a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface;

a spacer disposed on the memory first die, and wherein the spacer is disposed between the processor first die and the memory first die vertical bond wire.

21. The computing system of claim 20, further including:

a redistribution layer that contacts the processor bump array and the memory first die vertical bond wire and the memory subsequent die vertical bond wire; and a ball-grid array disposed on the redistribution layer, and wherein the redistribution layer is disposed between the processor first die, the spacer and the board.

\* \* \* \* \*